US009570169B1

(12) United States Patent
Czornomaz et al.

(10) Patent No.: US 9,570,169 B1
(45) Date of Patent: Feb. 14, 2017

(54) RESISTIVE MEMORY DEVICE

(71) Applicant: International Business Machines Corporation, Armonk, NY (US)

(72) Inventors: Lukas Czornomaz, Zurich (CH); Veeresh V. Deshpande, Zurich (CH); Vara Sudananda Prasad Jonnalagadda, Wädenswil (CH); Wabe Koelmans, Adliswil (CH); Abu Sebastian, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/173,280

(22) Filed: Jun. 3, 2016

(51) Int. Cl.
| | |
|---|---|
| *G11C 11/00* | (2006.01) |
| *G11C 13/00* | (2006.01) |
| *H01L 27/24* | (2006.01) |
| *H01L 45/00* | (2006.01) |

(52) U.S. Cl.
CPC ......... *G11C 13/004* (2013.01); *G11C 13/0004* (2013.01); *G11C 13/0069* (2013.01); *H01L 27/2436* (2013.01); *H01L 45/06* (2013.01); *H01L 45/1206* (2013.01); *H01L 45/1226* (2013.01)

(58) Field of Classification Search
CPC ....................................................... G11C 11/00
USPC .................................................. 365/148, 163
See application file for complete search history.

(56) References Cited

U.S. PATENT DOCUMENTS

| | | | | |
|---|---|---|---|---|
| 6,657,888 B1* | 12/2003 | Doudin | .......... | G11C 11/16 365/158 |
| 7,978,509 B2* | 7/2011 | Lung | .......... | G11C 8/14 365/148 |
| 8,320,171 B2* | 11/2012 | Park | .......... | G11C 13/0004 365/163 |
| 8,674,334 B2 | 3/2014 | Liu | | |
| 8,917,534 B2 | 12/2014 | Castro | | |
| 9,076,958 B2 | 7/2015 | Ahn | | |

(Continued)

OTHER PUBLICATIONS

Wabe W. Koelmans et al. Drifting phases and noise in phase-change memory. Sep. 4, 2015, Downloaded from http://www.theregister.co.uk/2015/09/04/drifting_phases_and_noise_in_phasechange_memory/ on Dec. 28, 2015. pp. 1-7.

(Continued)

*Primary Examiner* — Harry W Byrne
(74) *Attorney, Agent, or Firm* — Daniel P. Morris; Otterstedt, Ellenbogen & Kammer, LLP

(57) ABSTRACT

A memory device includes a plurality of memory cells and a control unit. The memory cells include a first segment including a resistive memory material for storing information in a plurality of resistance states, a second segment including a non-insulating material, a first terminal, a second terminal, and a third terminal. The first segment and the second segment are arranged in parallel between the first terminal and the second terminal. The control unit is configured to apply in a write mode a write voltage to the first and the second terminal for writing the resistance state, and to apply in a read mode a read voltage to the first and the second terminal for reading the resistance state, and to apply a control signal to the third terminal for adjusting the electrical resistance of the second segment. A related method and control unit are also disclosed.

20 Claims, 9 Drawing Sheets

(56) References Cited

U.S. PATENT DOCUMENTS

| | | | |
|---|---|---|---|
| 2005/0117388 A1* | 6/2005 | Cho | G11C 13/0004 365/163 |
| 2010/0195378 A1* | 8/2010 | Lung | G11C 11/5678 365/163 |
| 2010/0271868 A1* | 10/2010 | Park | G11C 13/0004 365/163 |
| 2014/0369113 A1 | 12/2014 | Krebs | |

OTHER PUBLICATIONS

Wabe W. Koelmans et al., Projected phase change memory devices, Nature Communications 6, Article No. 8181, Sep. 3, 2015, pp. 1-10.
S. Raoux et al., Phase-change random access memory: A scalable technology, IBM Journal of Research and Dev., vol. 52 Issue:4.5, Jul. 2008, 465-479, (Abstract only pp. 1-2).

* cited by examiner

Deselect

Write

Read

RESISTIVE MEMORY DEVICE

BACKGROUND

The invention is notably directed to a resistive memory device comprising a plurality of memory cells. The invention further concerns a related method and a related control unit.

Nanoscale memory devices, whose resistance depends on the history of the electric signals applied, could become critical building blocks in new computing paradigms, such as brain-inspired computing and memcomputing. However, there are key challenges to overcome, such as the high programming power required, noise and resistance drift.

One promising example for resistive memory devices are phase-change memory (PCM) devices. PCM is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The s programmable cell-states can be used to represent different data values, permitting storage of information.

In single-level PCM devices, each cell can be set to one of s=2 states, a "SET" state and a "RESET" state, permitting storage of one bit per cell. In the RESET state, which corresponds to an amorphous state of the phase-change material, the electrical resistance of the cell is very high. By heating to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state if rapidly cooled afterwards. In multilevel PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM material. Since the two material phases exhibit a large resistance contrast, varying the size of the amorphous phase within the overall cell volume produces a corresponding variation in cell resistance.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes current to flow through the cell, this current being dependent on the resistance of the cell. Measurement of the cell current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the s programmable cell-states.

Another type of resistive memory devices are resistive random-access memories (RRAM). This is a non-volatile memory technology in which the fundamental storage unit (the "cell") comprises a RRAM material located between a pair of electrodes. The RRAM material in these cells is an electrically-insulating matrix which normally presents a high resistance to electric current. Due to properties of the RRAM matrix or of the combination of matrix and electrode materials, however, it is a particular property of RRAM cells that an electrically-conductive path can be formed within the high-resistance matrix by application of a suitable voltage to the electrodes. This conductive path extends though the matrix in a direction between the electrodes. When the path connects the two electrodes, the resistance of the memory cell drops dramatically, leaving the cell in a low-resistance "SET" state. The conductive path can be broken or eliminated by application of another, "RESET" voltage to the electrodes, returning the cell to the high-resistance RESET state. Hence by appropriate application of SET and RESET pulses in a data write operation, individual cells can be programmed into one of two states with measurably-different resistance values, permitting storage of information with 1-bit per cell. The programmed cell state can be determined in a read operation using cell resistance as a metric for cell state. On application of a read voltage to the electrodes, the current which flows through the cell depends on the cell's resistance, whereby cell current can be measured to determine the cell state. The read voltage is significantly lower than the write voltage used for programming so that the read operation does not disturb the programmed cell state.

The document by Wabe W. Koelmans, Abu Sebastian, Vara Prasad Jonnalagadda, Daniel Krebs, Laurent Dellmann & Evangelos Eleftheriou, Nature Communications, 6, 2015, Article number: 8181, introduces the concept of a projected memory device, whose distinguishing feature is that the physical mechanism of resistance storage is decoupled from the information-retrieval process.

Accordingly there is a need for further improvements of memory devices.

SUMMARY

According to a first aspect, the invention is embodied as a memory device comprising a plurality of memory cells and a control unit for controlling the memory device. The memory cells comprise a first segment comprising a resistive memory material for storing information in a plurality of resistance states, a second segment comprising a non-insulating material, a first terminal, a second terminal, and a third terminal. The first segment and the second segment are arranged in parallel between the first terminal and the second terminal. The control unit is configured to apply in a write mode a write voltage to the first and the second terminal for writing the resistance state. The control unit is further configured to apply in a read mode a read voltage to the first and the second terminal for reading the resistance state. The control unit is configured to apply a control signal to the third terminal for adjusting the electrical resistance of the second segment.

According to another aspect, a method for operating a memory device according to the first aspect is provided. The method comprises a step of applying, by the control unit, in a write mode a write voltage to the first and the second terminal for writing the resistance state. A further step by the control unit comprises applying, in a read mode, a read voltage to the first and the second terminal for reading the resistance state. A further step comprises, by the control unit, a steps of applying a control signal to the third terminal for adjusting the electrical resistance of the second segment.

According to another aspect a control unit for controlling the operation of a memory device according to the first aspect is provided. The control unit is configured to apply in a write mode a write voltage to the first and the second terminal for writing the resistance state and in a read mode a read voltage to the first and the second terminal for reading the resistance state. The control unit is further configured to apply a control signal to the third terminal for adjusting the electrical resistance of the second segment.

Embodiments of the invention will be described in more detail below, by way of illustrative and non-limiting examples, with reference to the accompanying drawings.

DETAILED DESCRIPTION

In reference to FIGS. 1-16, some general aspects and terms of embodiments of the invention are described.

According to embodiments of the invention, a resistive memory material may be defined as a memory material whose electrical resistance can be changed by applying an electrical signal to the resistive memory material. The electrical signal may be e.g. a current flowing through the device, or an electrical voltage applied to the resistive memory device. The current and/or voltage may be e.g. applied to the resistive memory element in the form of pulses. As a result, the electrical resistance of a resistive memory element depends on the history of current that had previously flown trough the device and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

Figure 1:
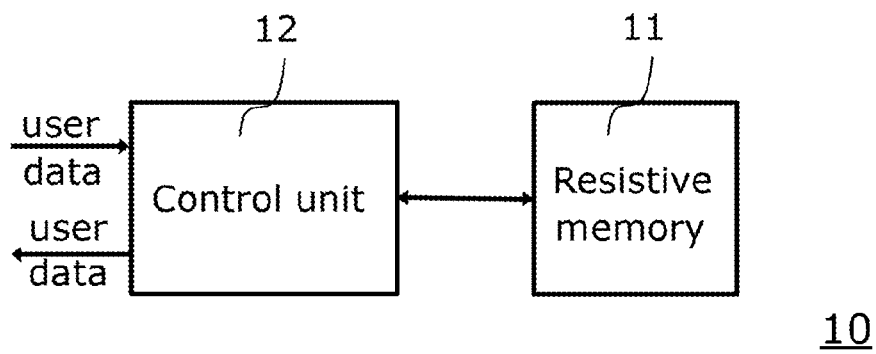
FIG. 1 illustrates a block diagram of a memory device according to an embodiment of the invention.

FIG. 1 is a simplified schematic block diagram of a memory device 10 embodying the invention. The device 10 includes a multilevel resistive memory 11 for storing data in one or more integrated arrays of resistive memory cells described below. Reading and writing of data to memory 11 is performed by a control unit 12. Control unit 12 comprises circuitry of generally known form for programming resistive memory cells during data write operations and making read measurements for detecting cell-state during data read operations. During these operations, the control unit can address individual resistive memory cells by applying appropriate control signals to an array of word and bit lines in the resistive memory 11. User data input to device 10 may be subjected to some form of write-processing, such as coding for error-correction purposes, before being supplied as write signal, in particular as write voltage, to the resistive memory 11. Similarly, read signals received from the resistive memory 11 may be processed by a read-processing module of the control unit 12, e.g. for code-word detection and/or error correction, to recover the original input user data.

The resistive memory 11 may be generally any kind of resistive memory as described above. In particular it may be a phase change memory (PCM) or a resistive random access memory (RRAM). In the following it assumed that the restive memory 11 is embodied as PCM. Accordingly the resistive memory 11 comprise a plurality of PCM cells as memory cells. The PCM cells of memory 11 may store information in s=2 or in s>2 programmable resistance states, the latter providing multilevel operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the amorphous phase within the otherwise crystalline PCM material. The s programmable cell-states are typically defined in control unit 12 in terms of predetermined reference values, or ranges of values, of the resistance metric used for read detection. To program a cell in a write operation, control unit 12 applies a voltage to the cell via the word- and bit-lines such that the resulting programming signal sets the cell to the required state. In a read operation, a (lower) read voltage is applied to the cell and the resulting cell current is measured to obtain the resistance metric. Control unit 12 can then detect the programmed cell state by comparing the read metric with the aforementioned reference values.

Figure 2:
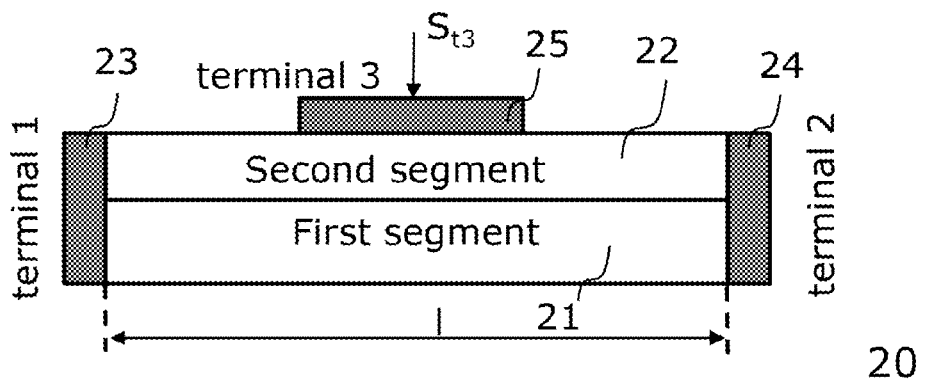
FIG. 2 shows a schematic cross sectional view of a memory cell according to an embodiment of the invention.

FIG. 2 is a schematic cross-sectional view of a memory cell 20 embodying the invention. The memory cell 20 comprises a first segment 21 comprising a PCM material such as a chalcogenide as resistive memory material for storing information in a plurality s of resistance states which correspond to the programmable cell-states. The memory cell 20 further comprises a second segment 22 comprising an electrically non-insulating material. The first segment 21 and the second segment 22 are arranged in parallel between a first terminal 23 and a second terminal 24. In parallel to and adjacent to the second segment 22 a third terminal 25 is provided. The first, the second and the third terminal are coupled to the control unit 12. The control unit 12 is adapted to apply control signals to the first, the second and the third terminal and to receive read-back signals from the resistive memory 11. More particularly, the control unit 12 is configured to apply in a write mode a write voltage to the first terminal 23 and the second terminal 24 for writing one of the plurality of resistance states to the memory cell. 20. Furthermore, the control unit 12 is configured to apply in a read mode a read voltage to the first terminal 23 and the second terminal 24, thereby reading the respective resistance state of the memory cell 20. In addition, the control unit 20 is configured to apply a control signal to the third terminal 25 for adjusting the electrical resistance of the second segment 22. The electrical resistance of the second segment 22 can be independently controlled by the control signals applied to the third terminal 25. This allows to adjust the current-voltage characteristic of the second segment 22. Providing the second segment 22 with a variable and tunable resistance may offer several advantages and several possibilities to tune the memory device 10. According to embodiments the resistance window can be tuned. According to further embodiments the fraction of current that flows through the first segment 21 and the second segment 22 in the various operation modes can be tuned. Furthermore, the ability to select or deselect a memory cell in an array configuration may be tuned. The first segment 21 and the second segment 22 are arranged in electrical contact with each other over substantially the whole length l between the first and the second terminal. According to embodiments the resistance of the second segment 22 forms a distributed resistance whose resistance per unit length of the length l can be adjusted by the control unit 12.

In an exemplary implementation of cell 20, the first segment may comprise GST as PCM material and the first and the second terminal may be formed of TiN.

Figure 3:
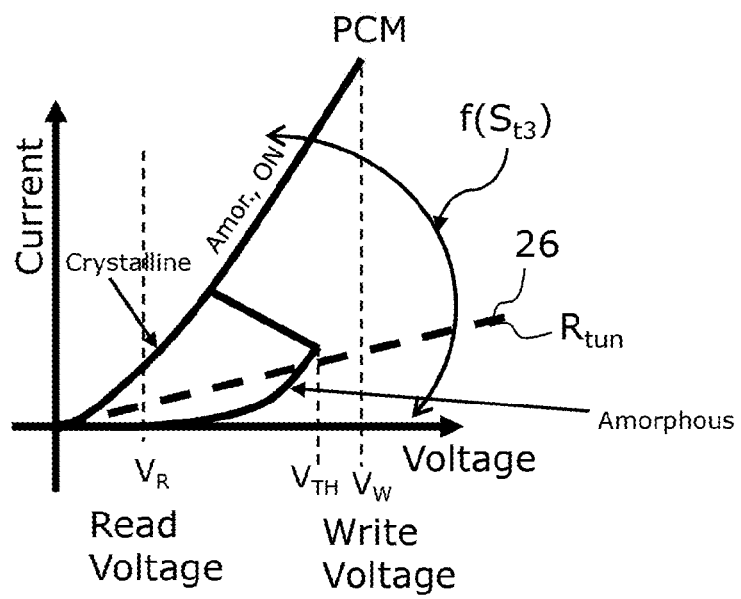
FIG. 3 illustrates voltage-current characteristics of operation modes of a memory cell according to an embodiment of the invention.

FIG. 3 is a schematic illustration of the current/voltage (and hence resistance) characteristics of the material components of the memory cell 20. The solid lines indicate variation of current with voltage for the PCM material of the first segment 21, starting from the fully-crystalline SET state (upper curve) and also the fully-amorphous RESET state (lower curve). These two curves reflect the large (typically 3 orders of magnitude) variation in resistivity between the crystalline and amorphous phases. The dashed line 26 in the plot indicates the current/voltage characteristic for the second segment 22. It can be seen that, at low voltages including the cell read voltage, the resistance of the second segment 22 is between that of the amorphous and crystalline phases of the first segment 21. The amorphous phase exhibits a non-linear characteristic with a threshold switching phenomenon that is field induced. At a certain threshold voltage VTH, this phase switches to a very low "ON-state" resistance corresponding to that of the crystalline PCM material. The cell programming (write) voltage is selected to be above this threshold voltage as indicated. At this voltage, the ON-resistance of the first segment 22 is much less than the resistance of the second segment 22. Accordingly, the write-current is substantially unaffected by the presence of the second segment 22.

As indicated by the semi-circular double-arrow, the I-V characteristic 26 of the second segment 22 can be tuned/changed by applying a control signal St3 to the third terminal 25. More particularly, the slope of the I-V curve 26 can be tuned/changed in accordance with the needs of the application and/or the operation mode of the memory device 10. In other words, the second segment 22 has a tunable resistance Rtun. Based on the above principles, preferred cell arrangements are embodied such that, at the cell read voltage, the resistance Rtun of the second segment 22 is adjusted such that it is far from both the resistance Ramo of the fully-amorphous (RESET) state, and also the resistance Rcry of the fully-crystalline SET state, of the PCM material (where "far" here means far within the context of the resistance range from Rcry to Ramo). In general, an appropriate value for Rtun in this range will depend on various factors such as the materials and dimensions of cell components, the particular characteristics of the s programmable cell states, the operating parameters (e.g. read and write voltages) of memory device 1 as well as desired performance criteria such as maximum acceptable error-rate. In general, however, the arrangement is preferably such that Rtun>>Rcry and Rtun<<Ramo within the context of the aforementioned range.

Due to the tunable resistance characteristics described above, the effect of resistance drift in the amorphous phase on cell read operations can be significantly reduced and even be adjusted during operation of the cell. More particularly, the ratio of currents that flows through the first segment 21 and the second segment 22 can be chosen and tuned by an appropriate choice of the tuned resistance Rtun. The second segment 22 provides a full parallel current path between the terminals 23, 24, providing drift-resistant operation regardless of amorphous size. Moreover, any residual drift effect (due to the very small current flowing through the amorphous phase) will exhibit low variability between different cell states. By tuning the resistance of the full parallel current path the very small current flowing through the amorphous phase can be tuned and it can be ensured that current through the second segment 22 will dominate as desired.

In effect, the programmed resistance state of the memory cell 20 can be considered to be projected onto the resistance of the second segment 22 in a read operation. During the low-field read process, the current bypasses the highly resistive amorphous region of the first segment 21 and flows through that part of the second segment 22 that is parallel to it. Accordingly the length of the current path through the second segment 22 reflects the amorphous size and hence the programmed resistance state. In other words, the second segment 22 may be considered as a projection segment during the read operation. The information that is typically stored into the length of the amorphous region in the first segment 21 is in a sense projected onto the second segment 22.

It should be noted that even though the second segment 22 is present during both the read and the write operation, according to embodiments the "projection" is designed to occur only during the read process. In effect, therefore, embodiments of the invention provide a decoupling of the read process and the write process.

Figure 4:
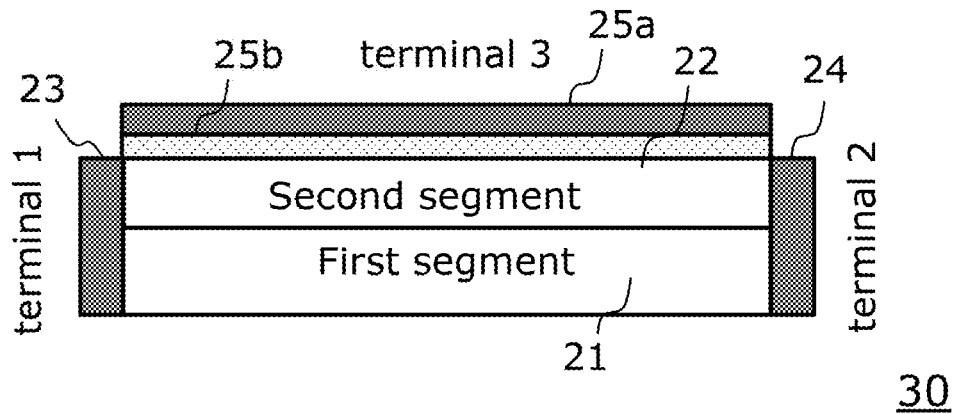
FIG. 4 shows another schematic cross sectional view of a memory cell according to an embodiment of the invention comprising a second segment that is configured as semiconductor channel of a MOSFET.

FIG. 4 shows a memory cell 30 according to an embodiment of the invention. According to this embodiment the second segment 22 is configured as semiconductor channel of a metal oxide semiconductor field effect transistor (MOSFET). The third terminal 25 is configured as gate of the MOSFET and the first terminal 23 and the second terminal 24 establish source and drain electrodes respectively of the MOSFET. According to a preferred embodiment the second segment 22 comprises poly-silicon or consists of poly-silicon. The terminal 25 comprises an upper layer 25a as gate electrode comprising an electrically conducting material such as a metal or polysilicon. Below the upper layer 25a in contact with the second segment 22 an insulating layer 25b is arranged which comprises an insulating gate oxide such as $SiO_2$.

Figure 5:
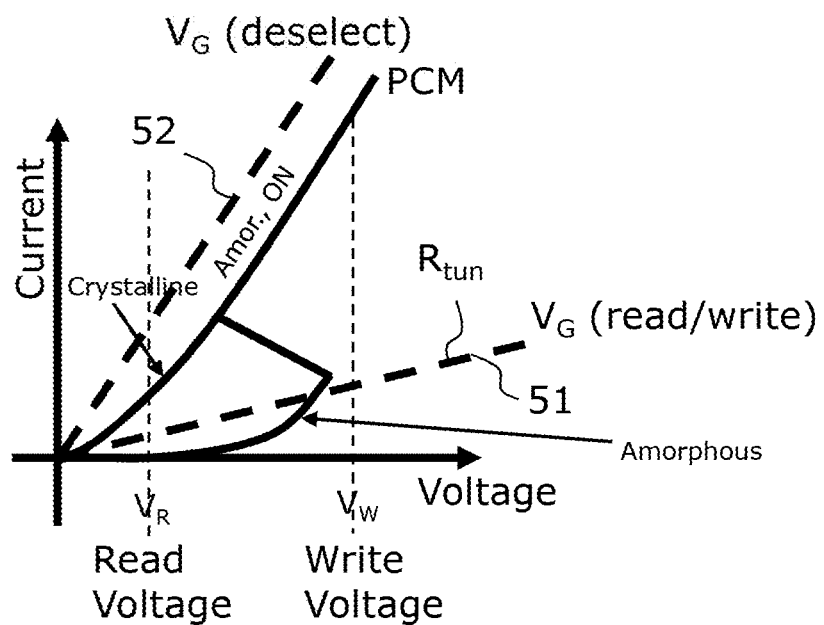
FIG. 5 is a schematic illustration of the current/voltage characteristics of the material components of a memory cell according to FIGS. 6a-6c.
Figure 6A:
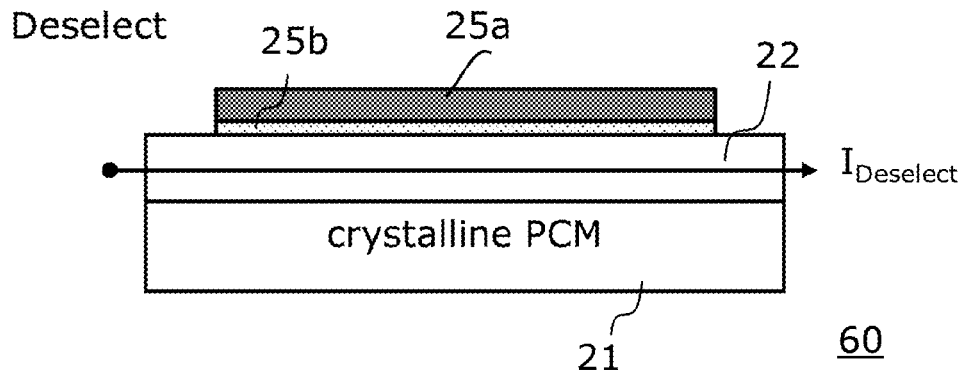
FIGS. 6a-6c show exemplary current flows through a memory cell according to an embodiment of the invention.
Figure 6B:
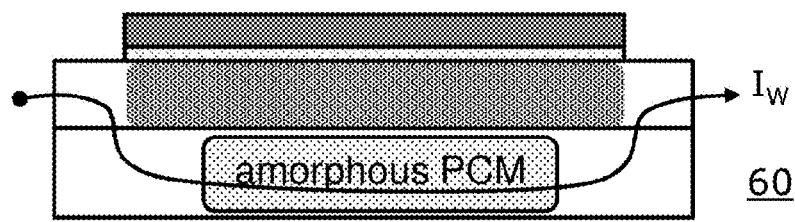
Figure 6C:
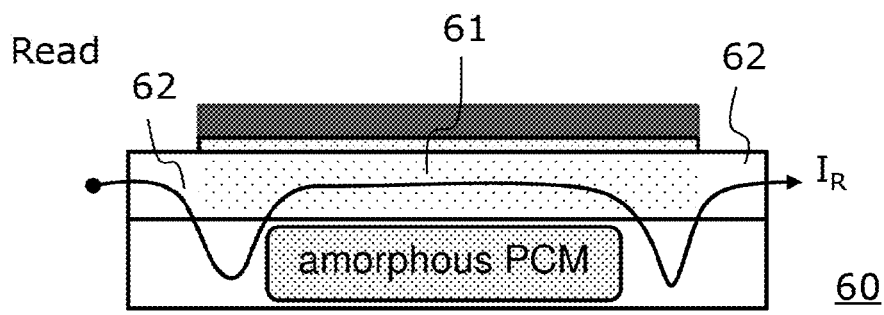

FIGS. 6a-6c show exemplary current flows through a memory cell 60, wherein the first segment 21 comprises a phase-change material and the second segment 22 is embodied as gate channel of a MOSFET. FIG. 5 is a corresponding schematic illustration of the current/voltage characteristics of the material components of the memory cell 60.

FIG. 6a shows the memory cell 60 in a deselect mode in which the ungated second segment 22 provides a lower resistance than a lowest resistance state of the first segment 21. In other words, the ungated second segment 22 has a lower resistance than the phase change material of the first segment 21 in its crystalline state. "Ungated" in this respect shall mean that the no gate voltage is applied to the third terminal 25. The low resistance of the second segment 22 in an ungated state may be achieved e.g. by silicidation, by providing highly doped regions and/or by a fringe-field of neighboring gates. Accordingly, in the deselect mode a current, if any, would only flow through the second segment 22, but not through the first segment 21. This allows to bypass the respective cell, which may e.g. facilitate to address neighboring cells. Generally the deselect mode may be used to keep the respective memory cell inactive, i.e. it is neither read from the cell nor it is written to the respective cell.

FIG. 6b illustrates the memory cell 60 in a write mode in which information is written to the cell 60 or in other words in which the cell 60 is programmed. In the write mode a write voltage $V_W$ is applied between the first terminal 23 and the second terminal 24. The write voltage $V_W$ is higher than the threshold voltage $V_{TH}$ and accordingly the amorphous phase of the phase change material is in an on-state having a low resistance corresponding to the crystalline phase of the phase change material. The gate voltage $V_G$ applied to the third terminal 25 is chosen such that the resistance of the second segment 22 is higher than the resistance of the amorphous phase of the phase change material in its on-state. Accordingly the write current flows through the first segment 21 and information can be written to the first segment 21.

FIG. 6c illustrates the memory cell 60 in a read mode in which information is read from the cell 60. In the read mode a read voltage $V_R$ is applied between the first terminal 23 and the second terminal 24. The read voltage $V_R$ is lower than the threshold voltage $V_{TH}$ and accordingly the amorphous phase of the phase change material is in an off-state having high resistance. The gate voltage $V_G$ applied to the third terminal 25 is chosen such that the resistance of the second segment 22 is lower than the resistance of the amorphous phase of the phase change material in its off-state. Accordingly the read current $I_R$ bypasses the amorphous material of the first segment 21 and the information stored by the amorphous region of the first segment 21 can be read out. According to this embodiment the gate voltages $V_G$ in the read- and the write mode may be the same, but they may also be different, provided the above mentioned resistance characteristics have been met.

The solid lines of FIG. 5 indicate variations of current with voltage for the PCM material of the first segment 21 as already explained with reference to FIG. 3. The dashed line 52 ($V_G$ deselect) indicates the I-V curve for the deselect mode of the memory cell 60 in which no gate voltage is applied to the third terminal 25. The dashed line 51 ($V_G$ (read/write) indicates the I-V curve for the read and the write mode of the memory cell 60. In this example it is assumed that the same gate voltage $V_G$ is applied to the third terminal 25 in the read mode and the write mode, but according to other embodiments also different gate voltages and hence different resistances could be used for the read mode and the write mode.

In the read mode as illustrated in FIG. 6c, the resistance Rtun presented by the second segment 22 to a cell current produced by the read voltage is in a gated area 61 below the third terminal 25 less than that of the amorphous phase of the phase-change material of the first segment 21 and greater than that of the crystalline phase of the phase-change material 21. In an area 62 outside the reach of the third terminal 25 (which may be considered as an ungated area) the second segment 22 still provides a lower resistance than the crystalline phase of the first segment 21. As a consequence, the gated area 61 of the second segment 22 presents a lower-resistance current path to the cell read current than the amorphous phase in any programmed cell state. Accordingly the current path through the second segment 22 has a length dependent on the size of the amorphous phase in the first segment 21 as illustrated in FIG. 6c.

Figure 7A:
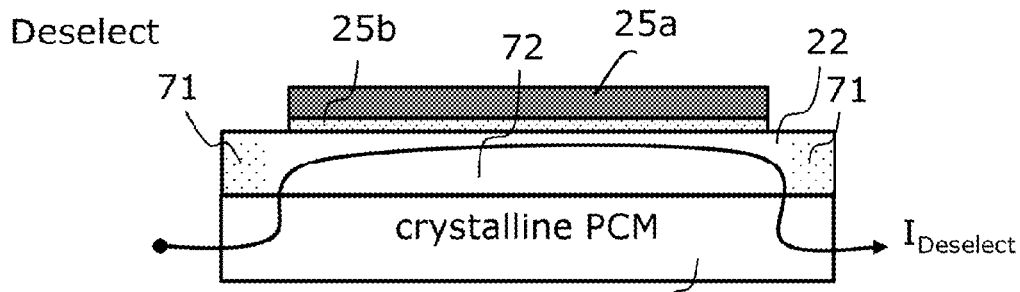
FIGS. 7a-7c show exemplary current flows through a memory cell according to another embodiment of the invention.
Figure 7B:
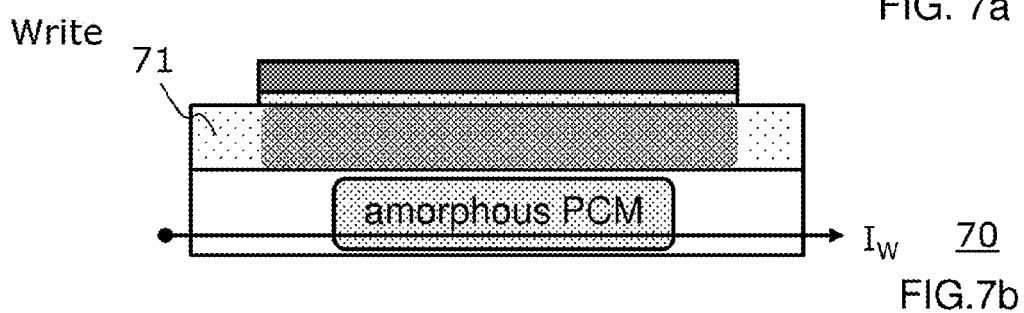
Figure 7C:
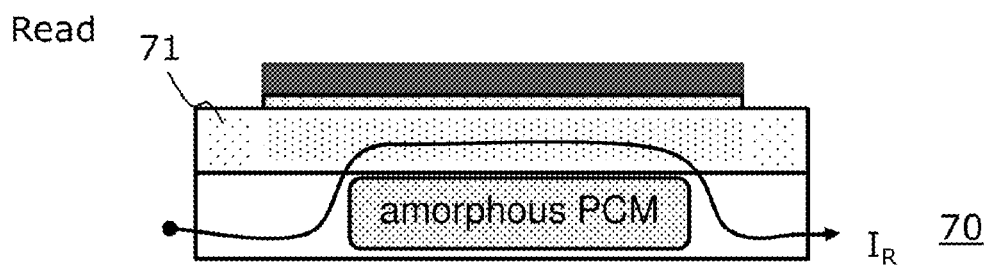
Figure 8:
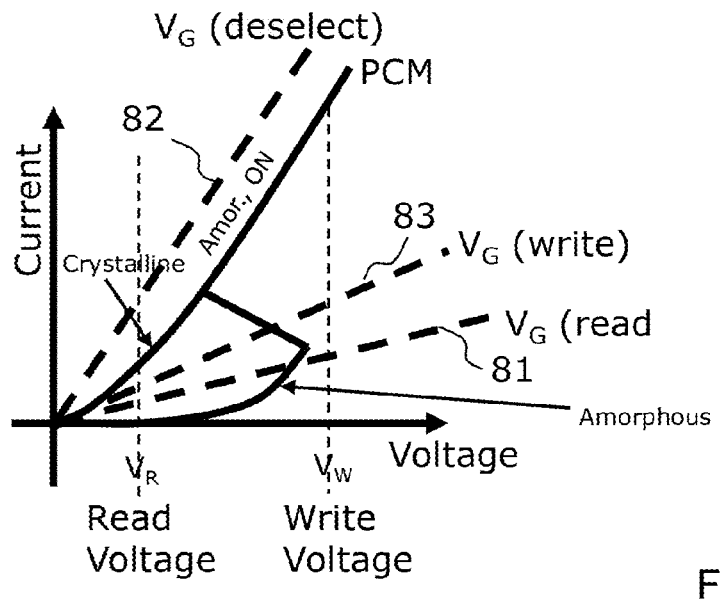
FIG. 8 is a schematic illustration of the current/voltage characteristics of the material components of the memory cell according to FIGS. 7a-7c.

FIGS. 7a-7c show exemplary current flows through a memory cell 70, wherein the first segment 21 comprises a phase-change material and the second segment 22 is embodied as gate channel of a MOSFET. FIG. 8 is a corresponding schematic illustration of the current/voltage characteristics of the material components of the memory cell 70.

FIG. 7a shows the memory cell 70 in a deselect mode. In this embodiment it is assumed that the resistance of the ungated channel of the second segment 22 is higher than the resistance of the crystalline phase change material in the first segment 21. Accordingly the second segment 22 comprises an ungated area 71 which is understood as an area in which the third terminal 25 which functions as a gate of the MOSFET does not have an influence anymore on the I-V characteristic of the gate channel. In a gated area 72 below the gate, i.e. below the third terminal 25, the second segment 22 provides a lower resistance than the phase change material of the first segment 21 in its crystalline state. This low resistance state of the area 72 can be achieved by opening the channel of the MOSFET by applying an appropriate deselect gate voltage to the third terminal 25. Accordingly, in the deselect mode of this embodiment, a current, if any, flows from the first terminal 23 to the crystalline first segment 21. Then, after the area 71, the current preferentially flows through the gated area 72 of the second segment 22 and finally returns back through the second segment 22 to the second terminal 24.

FIG. 7b illustrates the memory cell 70 in a write mode in which information is written to the cell 70. The gate voltage $V_G$ applied to the third terminal 25 is chosen such that the resistance of the second segment 22 is higher than the resistance of the amorphous phase of the phase change material in its on-state. As furthermore the resistance of the ungated channel in the area 71 is higher than the resistance of the crystalline phase change material in the first segment 21, the write current flows only through the first segment 21 and information can be written to the first segment 21.

FIG. 7c illustrates the memory cell 70 in a read mode in which information is read from the cell 70. The gate voltage $V_G$ applied to the third terminal 25 is chosen such that the resistance of the second segment 22 is lower than the resistance of the amorphous phase of the phase change material in its off-state. Accordingly the read current $I_R$ bypasses the amorphous material of the first segment 21 and the information stored by the amorphous region of the first segment 21 can be read out.

The solid lines of FIG. 8 indicate variations of current with voltage for the PCM material of the first segment 21 as already explained with reference to FIG. 3. The dashed line 82 ($V_G$ deselect) indicates the I-V curve for the deselect mode of the memory cell 70. According to this embodiment there is applied a gate voltage $V_G$ (deselect) which influences the area 72 below the third terminal 25 and reduces the resistance of the area 72 compared with a state in which no gate voltage is applied to the third terminal 25. The dashed line 81 ($V_G$ (read)) indicates the I-V curve for the read mode and the dashed line 83 ($V_G$ (write)) indicates the I-V curve for the write mode. In this example it is assumed that a different gate voltage $V_G$ is applied to the third terminal 25 in the read mode and the write mode. More particularly, the gate voltage in the write mode is higher than the gate voltage in the read mode, thereby providing a lower resistance of the second segment 22 in the write mode than in the read mode.

Figure 9:
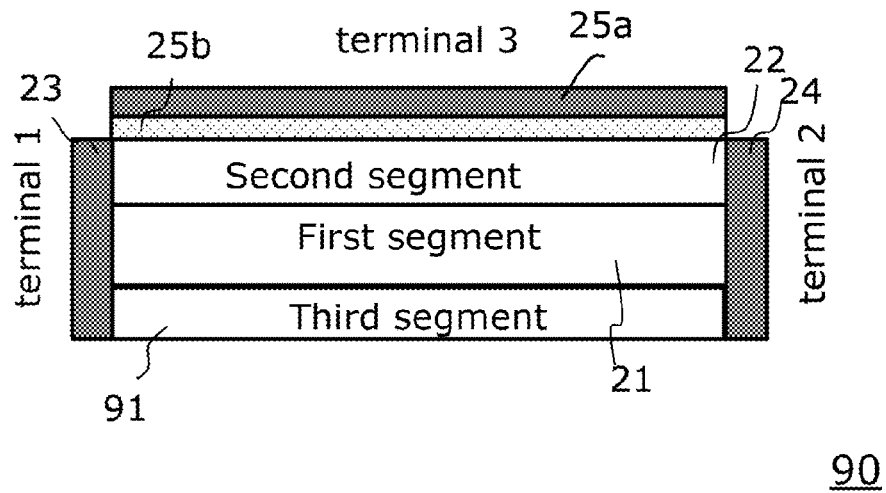
FIG. 9 shows another schematic cross sectional view of a memory cell according to an embodiment of the invention comprising a second segment with a variable resistance and a third segment with a fixed resistance.

FIG. 9 shows a memory cell 90 according to another embodiment of the invention. According to this embodiment the second segment 22 is also configured as semiconductor channel of a metal oxide semiconductor field effect transistor (MOSFET). The third terminal 25 is configured as gate electrode of the MOSFET and the first terminal 23 and the second terminal 24 establish source and drain electrodes respectively of the MOSFET. The terminal 25 comprises an upper layer 25a comprising an electrically conducting material such as a metal or polysilicon. Below the upper layer 25a in contact with the second segment 22 a layer 25b is arranged which comprises a gate oxide.

The memory cell 90 comprises further a third segment 91 with a fixed resistance. The fixed resistance of the third segment 91 is configured to be lower than the variable resistance of the second segment 22 in the write mode and in the read mode.

Such embodiments with a third segment 90 of a fixed resistance may provide more design freedom, e.g. for temperature dependence and noise characteristics. Furthermore, such embodiments may ease the operation as the gate channel of the second segment 22 may only be used for on/off operation.

Figure 10:
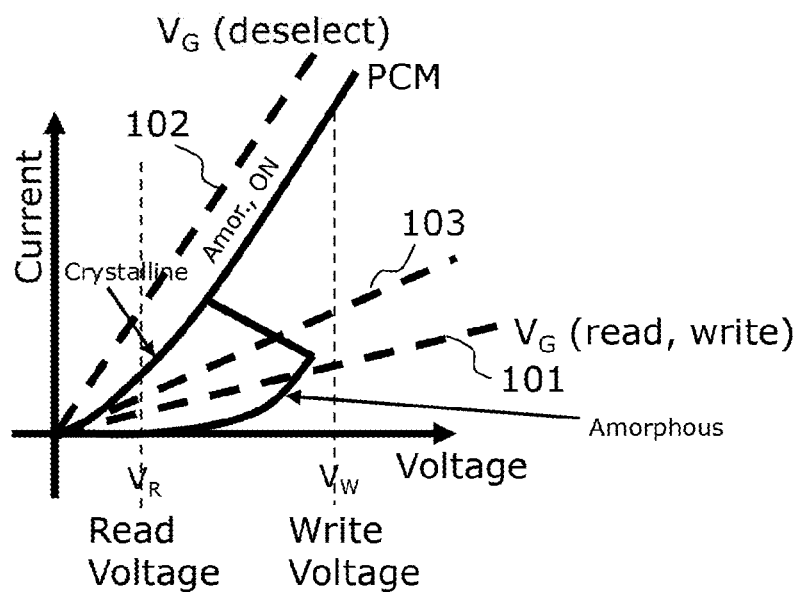
FIG. 10 is a schematic illustration of the current/voltage characteristics of the material components of a memory cell according to FIGS. 11a-11c.
Figure 11A:
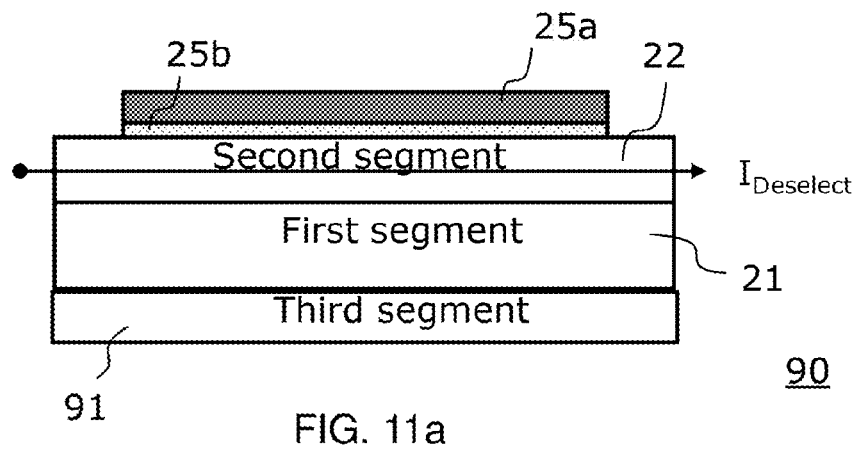
FIGS. 11a-11c show exemplary current flows through the memory cell of FIG. 9.
Figure 11B:
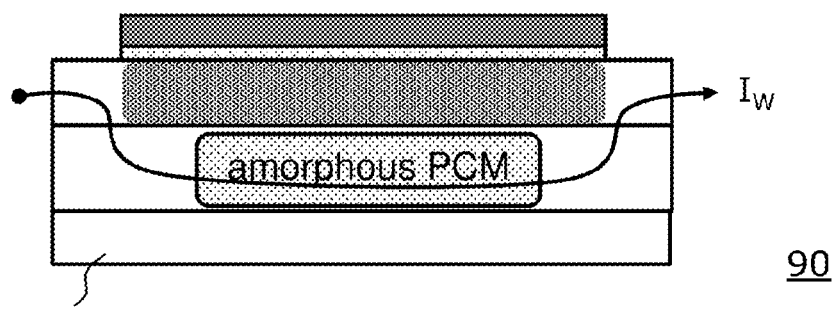
Figure 11C:
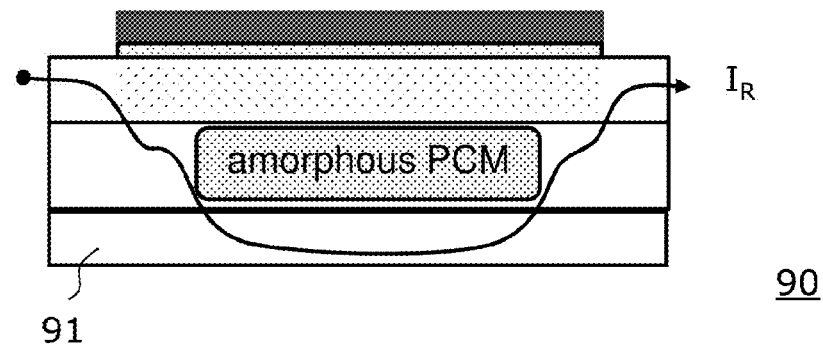

FIGS. 11a-11c show exemplary current flows through the memory cell 90. FIG. 10 is a corresponding schematic illustration of the current/voltage characteristics of the material components of the memory cell 90.

FIG. 11a shows the memory cell 90 in a deselect mode. In this embodiment the ungated second segment 22 provides a lower resistance than a lowest resistance state of the first segment 21. In other words, the ungated second segment 22 has a lower resistance than the phase change material of the first segment 21 in its crystalline state. Accordingly, in the deselect mode a current, if any, flows only through the second segment 22, but not through the first segment 21 and not through the third segment 91. This allows it to bypass the respective cell.

FIG. 11b illustrates the memory cell 90 in a write mode in which information is written to the cell 90. The gate voltage $V_G$ applied to the third terminal 25 is chosen such that the resistance of the second segment 22 is higher than the resistance of the amorphous phase of the phase change material in its on-state. As furthermore the resistance of the third segment 91 is higher than the resistance of the amorphous phase of the phase change material in its on-state, write current flows only through the first segment 21 and information can be written to the first segment 21.

FIG. 11c illustrates the memory cell 90 in a read mode in which information is read from the cell 90. The gate voltage $V_{G\ applied}$ to the third terminal 25 is chosen such that the resistance of the second segment 22 is higher than the resistance of the third segment 91. As furthermore the resistance of the third segment 91 is lower than the resistance of the amorphous phase in its off-state, the read current $I_R$ bypasses the amorphous material of the first segment 21 and by the second segment 22. Accordingly the read current $I_R$ flows through the third segment 91.

The solid lines of FIG. 10 indicate variations of current with voltage for the PCM material of the first segment 21 as already explained with reference to FIG. 3. The dashed line 102 ($V_G$ deselect) indicates the I-V curve for the deselect mode of the memory cell 90 in which the ungated second segment 22 provides a lower resistance than a lowest resistance state of the first segment 21 and also of the third segment 91. The dashed line 101 ($V_G$ (read/write) indicates the I-V curve for the read and the write mode of the memory cell 90. In this example it is assumed that the same gate voltage $V_G$ is applied to the third terminal 25 in the read mode and the write mode, but according to other embodiments also different gate voltages and hence different resistances could be used for the read mode and the write mode. The dashed line 103 indicates the I-V curve for the third segment 91, i.e. the segment with a fixed resistance.

FIGS. 12-15 provide 3-dimensional views of memory cells according to exemplary embodiments of the invention. As can be seen in these figures, the memory cells have a cylindrical shape. Such a shape may facilitate advanced and efficient device manufacturing as well as dense device integration.

Figure 12:
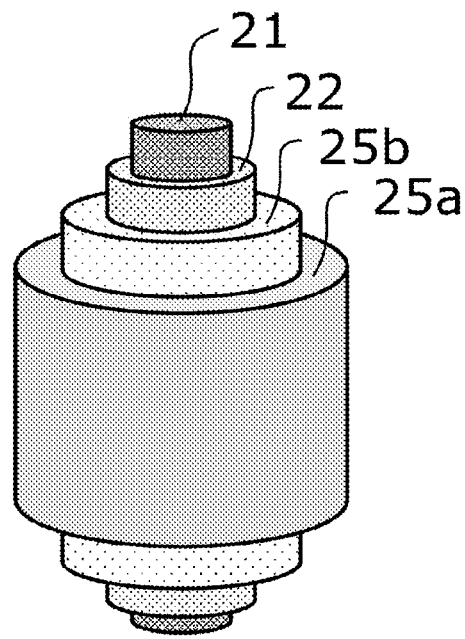
FIG. 12 shows a 3-dimensional simplified cutaway view of a memory cell according to an embodiment of the invention.

FIG. 12 shows a partly cut-away view of a memory cell 120 comprising the first segment 21, embodied as PCM material, as inner cylindrical segment. The first segment 21 is surrounded by the second segment 22 which has the form of a hollow cylinder. The second segment 22 is surrounded by the third terminal 25 which also has the form of a hollow cylinder. The third terminal 25 comprises an outer hollow cylinder 25a comprising an electrically conducting material such as a metal or polysilicon and an inner hollow cylinder 25b in contact with the second segment 22 which comprises a gate oxide. As in embodiments illustrated above, the second segment 22 is configured as active semiconductor channel of a metal oxide semiconductor field effect transistor (MOSFET) and the third terminal 25 is configured as gate electrode of the MOSFET. The top and bottom ends of the memory cell 120 are adapted to be connected to the first terminal and the second terminal which have been omitted for ease of illustration. The not shown first terminal and the not shown second terminal establish source and drain electrodes respectively.

Figure 13:
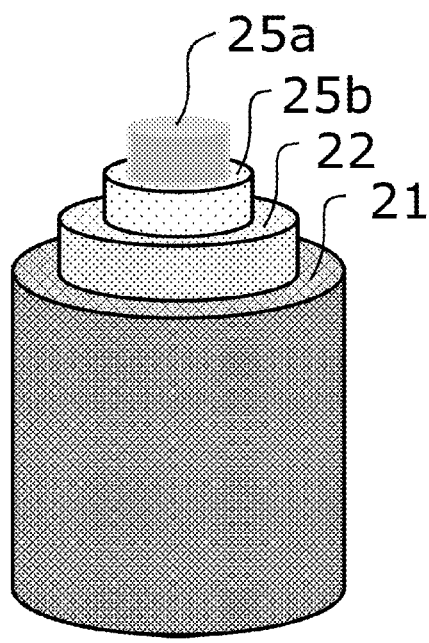
FIG. 13 shows another 3-dimensional cutaway view of a memory cell according to an embodiment of the invention.

FIG. 13 shows a partly cut-away view of a memory cell 130 in which the order of the cylinders establishing the memory cell is reversed compared with FIG. 13. Accordingly the inner cylindrical segment is formed as gate electrode 25a, surrounded by the gate oxide 25a, the second segment 22 (active channel) and the first segment 21 (PCM).

Figure 14:
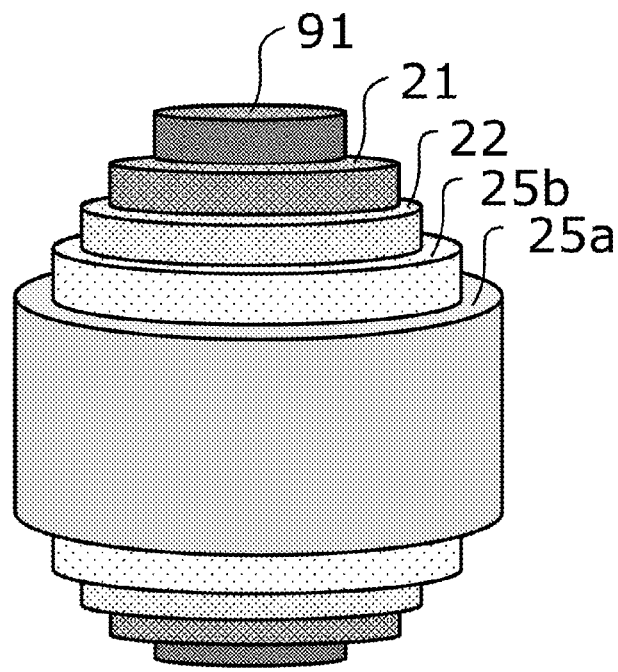
FIG. 14 shows another 3-dimensional cutaway view of a memory cell according to an embodiment of the invention.

FIG. 14 shows a partly cut-away view of an embodiment comprising also a third segment 91 with a fixed resistance. The third segment 91 is embodied as inner cylindrical segment. The third segment 91 is surrounded by the first segment 21 which has the form of a hollow cylinder. The first segment 21 is surrounded by the second segment 22 which has the form of a hollow cylinder. The second segment 22 is surrounded by the third terminal 25 which also has the form of a hollow cylinder. The third terminal 25 comprises an outer hollow cylinder 25a comprising an electrically conducting material such as a metal or polysilicon and an inner hollow cylinder 25b in contact with the second segment 22 which comprises a gate oxide.

Figure 15:
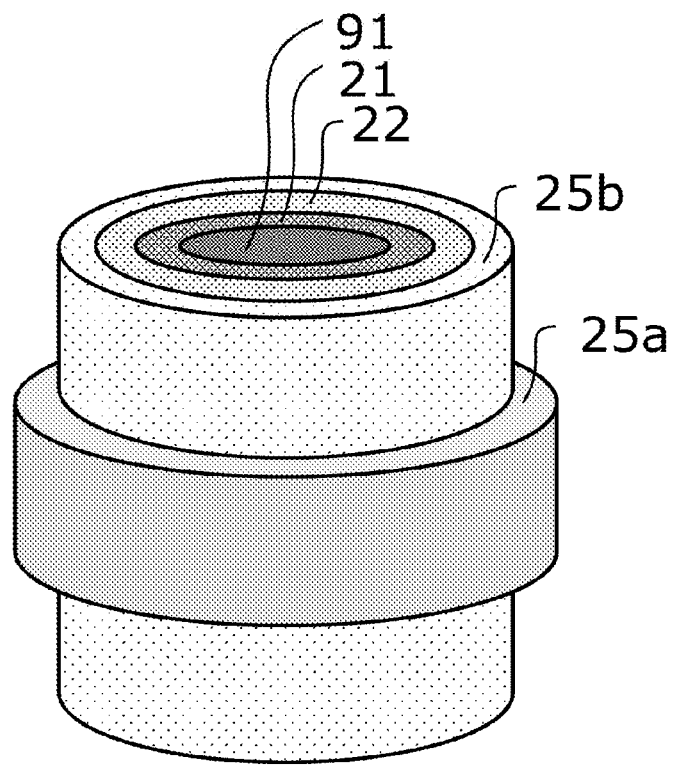
FIG. 15 shows another 3-dimensional view of a memory cell according to an embodiment of the invention.

While FIGS. 12-14 show partly cut-away views in which the respective hollow cylinders have been shortened/partly cut away in a staggered manner to ease the view, FIG. 15 shows the embodiment according to FIG. 14 with cylinders having their full length.

The memory cells of FIGS. 12-15 can be fabricated using well-known material processing techniques for formation of the various elements of the cell. By way of example, the cylindrical structure may be produced by a keyhole-transfer process as described in Raoux et al., IBM J. Res. & Dev. 52(4/5), 465 (2008), (see FIG. 6 thereof). In general, however, the materials and dimensions of the cells are selected to satisfy the particular needs of the respective application.

Figure 16:
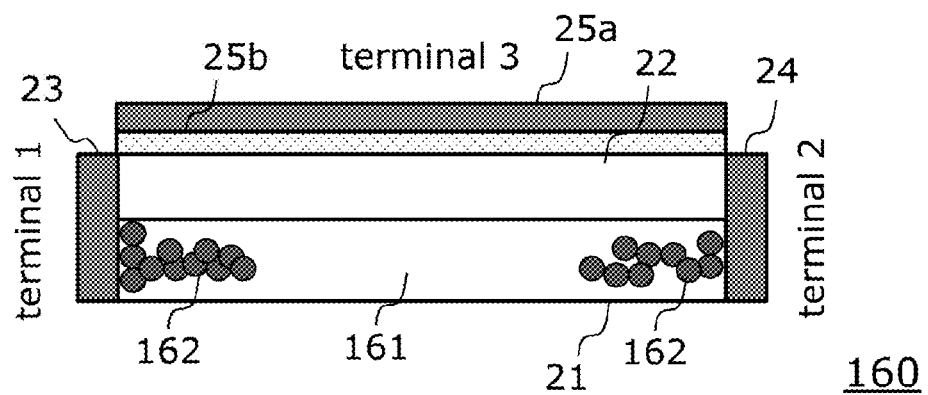
FIG. 16 is a schematic cross-sectional view of a RRAM cell 160 embodying the invention.

FIG. 16 is a schematic cross-sectional view of a RRAM cell 160 embodying the invention. The cell 160 has first segment 21 comprising an electrically-insulating RRAM matrix material 161 located between a first terminal 23 and a second terminal 24 for connecting the cell to the word and bit lines respectively of the cell array. The matrix material 161 is shown in the figure containing a conductive path 162 which extends within the matrix material 161 in a direction between the terminals 23, 24. Cell 160 further includes a second segment 22 which extends in a direction between the terminals 23, 24 in contact with the matrix material 161. In parallel to and adjacent to the second segment 22 a third terminal 25 is provided for controlling the resistance of the second segment 22.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While particular examples have been given for illustrative purposes above, any materials and dimensions giving the required properties and resistance characteristics may be selected for the various elements of cells embodying the invention. Alternative phase change materials include other compounds of some or all elements Ge, Sb and Te, Ga such as Ge2Sb2Te5, GeTe, and Ge15Sb85. GaSb for example. Such compounds may also have added constituents such as carbon, nitrogen, silicon, or silicon dioxide for instance. Other possible materials include In—Ge—Te alloys, Si—Sb—Te alloys and Si—Sb alloys. One can also foresee the use of phase change nanowires in the fabrication of such memory cells. In general, the second segment 22 may be formed of any suitable material whose resistance can be tuned/varied. Examples of such materials include semiconductors such as silicon or germanium (with and without doping) and in particular poly-silicon as mentioned above. The first, the second and the third terminal may be formed of any convenient electrically-conductive material, typically a metallic material (e.g. a pure metal or a metal compound, alloy or other mixture) or a doped semiconductor material such as silicon. Furthermore, the terminals could be formed by the materials already present.

Moreover, the features described may be applied to single-level as well as multi-level cells.

In general, modifications described for one embodiment may be applied to another embodiment as appropriate.

What is claimed is:

1. A memory device comprising:
a plurality of memory cells; and
a control unit for controlling the memory device;
wherein the memory cells comprise
a first segment comprising a resistive memory material for storing information in a plurality of resistance states;
a second segment comprising a non-insulating material;
a first terminal;
a second terminal; and
a third terminal;
wherein the first segment and the second segment are arranged in parallel between the first terminal and the second terminal; and
wherein the control unit is configured to apply
in a write mode a write voltage to the first and the second terminal for writing the resistance state;
in a read mode a read voltage to the first and the second terminal for reading the resistance state;
a control signal to the third terminal for adjusting the electrical resistance of the second segment.

2. The memory device according to claim 1, wherein
the second segment is configured as semiconductor channel of a Field Effect Transistor (FET); and
the third terminal is configured as gate electrode of the FET.

3. The memory device according to claim 2, wherein the FET is configured as Metal Oxide Semiconductor (MOSFET).

4. The memory device according to claim 2, wherein the second segment comprises poly-silicon.

5. The memory device according to claim 1, wherein the third terminal is arranged in parallel to and adjacent to the second segment.

6. The memory device according to claim 1, wherein the first and the second segment are arranged adjacent to each other and in electrical contact with each other over substantially the whole length between the first and the second terminal.

7. The memory device according to claim 1, wherein the resistance of the second segment forms a distributed resistance whose resistance per unit length can be adjusted by the control unit.

8. The memory device according to claim 1, wherein the second segment is configured to have a lower resistance in the write mode than in the read mode.

9. The memory device according to claim 1, wherein the device comprises a deselect mode in which the second segment is configured to provide a lower resistance than a lowest resistance state of the first segment.

10. The memory device according to claim 1, comprising a third segment with a fixed resistance, wherein the fixed resistance of the third segment is configured to be lower than the variable resistance of the second segment in the write mode and in the read mode.

11. The memory device according to claim 1, wherein the device is configured such that in the write mode the resistance presented by the second segment to a cell current produced by the write voltage is higher than the resistance of the first segment in any of the resistance states.

12. The memory device according to claim 1, wherein the first segment comprises a phase change material.

13. The memory device according to claim 12, wherein the device is configured such that in the read mode the resistance presented by the second segment to a cell current produced by the read voltage is lower than the resistance of the amorphous phase of the memory cell in any of said resistance states.

14. The memory device according to claim 12, wherein the second segment extends in a direction between the first and the second terminal in contact with the phase-change material and is arranged to present, to a cell current produced by the read voltage, a lower-resistance current path than the amorphous phase of the phase-change material in any of said cell states, said current path having a length dependent on the size of said amorphous phase.

15. The memory device according to claim 1, wherein the first segment comprises a resistive random access memory (RRAM) material.

16. The memory device according to claim 15, wherein the first segment comprises an electrically-insulating matrix such that an electrically-conductive path, extending in a direction between the first and the second terminal, can be formed within the matrix on application of a write voltage to the first and the second terminal, said resistance states corresponding to respective configurations of the conductive path in the matrix.

17. The memory device as claimed in claim 1 for storing information in $s>2$ programmable resistance states.

18. The memory device as claimed in claim 1, wherein the memory cells have a cylindrical shape.

19. A control unit for controlling the operation of a memory device according to claim 1, the control unit being configured to apply
in a write mode a write voltage to the first and the second terminal for writing the resistance state;
in a read mode a read voltage to the first and the second terminal for reading the resistance state; and
a control signal to the third terminal for adjusting the electrical resistance of the second segment.

20. A method for operating a memory device comprising a plurality of memory cells; and
a control unit for controlling the memory device;
wherein the memory cells comprise
a first segment comprising a resistive memory material for storing information in a plurality of resistance states;
a second segment comprising a non-insulating material;
a first terminal;
a second terminal; and
a third terminal;
wherein the first segment and the second segment are arranged in parallel between the first terminal and the second terminal, the method comprising
applying, by the control unit,
in a write mode a write voltage to the first and the second terminal for writing the resistance state;
in a read mode a read voltage to the first and the second terminal for reading the resistance state; and
a control signal to the third terminal for adjusting the electrical resistance of the second segment.

* * * * *